(12) United States Patent
Seo (10) Patent No.: US 10,718,814 B2
(45) Date of Patent: Jul. 21, 2020

(54) BATTERY TESTING APPARATUS AND METHOD

(71) Applicant: LG CHEM, LTD., Seoul (KR)

(72) Inventor: Se-Wook Seo, Daejeon (KR)

(73) Assignee: LG Chem, Ltd. (KR)

( * ) Notice: Subject to any disclaimer, the term of this patent is extended or adjusted under 35 U.S.C. 154(b) by 327 days.

(21) Appl. No.: 15/707,567

(22) Filed: Sep. 18, 2017

(65) Prior Publication Data

US 2018/0080990 A1 Mar. 22, 2018

(30) Foreign Application Priority Data

Sep. 19, 2016 (KR) .......................... 10-2016-0119292

(51) Int. Cl.
| | |
|---|---|
| *G01R 31/36* | (2020.01) |
| *G01R 31/382* | (2019.01) |
| *G01R 31/387* | (2019.01) |
| *H01M 10/42* | (2006.01) |
| *G01R 31/367* | (2019.01) |
| *G01R 31/3842* | (2019.01) |
| *H01M 10/48* | (2006.01) |

(Continued)

(52) U.S. Cl.
CPC ......... *G01R 31/382* (2019.01); *G01R 31/367* (2019.01); *G01R 31/387* (2019.01); *G01R 31/3842* (2019.01); *H01M 10/4285* (2013.01); *H01M 10/48* (2013.01); *H01M 10/486* (2013.01); *G01R 31/389* (2019.01); *G01R 31/392* (2019.01)

(58) Field of Classification Search
CPC ... G01R 31/382; G01R 31/387; H01M 10/48; H01M 10/486

USPC .......................................................... 702/63
See application file for complete search history.

(56) References Cited

U.S. PATENT DOCUMENTS

| | | | | |
|---|---|---|---|---|
| 5,321,627 A | * | 6/1994 | Reher | ................ G01R 31/3648 |
| | | | | 702/63 |
| 2010/0036626 A1 | * | 2/2010 | Kang | ................... G01R 31/392 |
| | | | | 702/63 |

(Continued)

FOREIGN PATENT DOCUMENTS

| | | |
|---|---|---|
| JP | 2010127880 A | 6/2010 |
| JP | 2013096861 A | 5/2013 |

(Continued)

*Primary Examiner* — Michael P Nghiem
(74) *Attorney, Agent, or Firm* — Lerner, David, Littenberg, Krumholz & Mentlik, LLP (57) ABSTRACT

A battery testing apparatus including a memory unit configured to store profile data of a battery; an interface unit configured to receive a signal designating a specific future date after the beginning of life of the battery at which a lowest SOC according to degradation of the battery is to be predicted; and a processor connected to the memory and interface units to communicate therewith. The profile data includes first, second and third look-up tables in which open circuit voltages for each SOC from the battery in the beginning of life, closed and open circuit voltages for each SOC from an equivalent circuit of the battery in the beginning of life, and resistance increase rates predetermined for each use period, are respectively recorded. The processor predicts the lowest SOC at the specific date according to the degradation of the battery with reference to the first, second and third look-up tables.

10 Claims, 8 Drawing Sheets

(51) Int. Cl.
*G01R 31/389* (2019.01)
*G01R 31/392* (2019.01)

(56) References Cited

U.S. PATENT DOCUMENTS

| | | | |
|---|---|---|---|
| 2010/0138178 A1* | 6/2010 | Paryani | G01R 31/3842 |
| | | | 702/63 |
| 2014/0225571 A1* | 8/2014 | Obata | H01M 10/44 |
| | | | 320/136 |
| 2015/0032394 A1 | 1/2015 | Kimura et al. | |
| 2016/0054392 A1 | 2/2016 | Lee et al. | |
| 2018/0375176 A1* | 12/2018 | Sakabe | H02J 7/007 |

FOREIGN PATENT DOCUMENTS

| | | |
|---|---|---|
| JP | 2015025686 A | 2/2015 |
| KR | 10-2011-0081604 A | 7/2011 |
| KR | 10-2013-0046946 A | 5/2013 |
| KR | 10-2015-0065398 A | 6/2015 |

\* cited by examiner

| SOC[%] | OCV[V] |
|---|---|
| 5.8811 | 2.538 |
| 5.8784 | 2.537 |
| 5.8783 | 2.536 |
| 5.876 | 2.534 |
| 5.8742 | 2.533 |
| 5.8722 | 2.532 |
| 5.8701 | 2.530 |
| 5.8681 | 2.529 |
| 5.8660 | 2.526 |
| 5.8640 | 2.523 |
| 5.8621 | 2.521 |
| 5.8602 | 2.518 |
| 5.8582 | 2.515 |
| 5.8563 | 2.513 |
| 5.8544 | 2.511 |
| 5.8525 | 2.509 |
| 5.8506 | 2.507 |
| 5.8488 | 2.505 |
| 5.8469 | 2.502 |
| 5.8449 | 2.501 |
| 5.8430 | 2.500 |

LUT1

LUT3

| USE PERIOD [year] | RESISTANCE INCREASE RATE [%] |
|---|---|
| 0 | 0 |
| 1 | 5 |
| 2 | 11 |
| ⋮ | ⋮ |
| 7 | 20 |
| 8 | 22 |
| ⋮ | ⋮ |
| 20 | 28 |
| ⋮ | ⋮ |

| LUT1 | |
|---|---|
| SOC[%] | OCV[V] |
| 5.8811 | 2.538 |
| 5.8784 | 2.537 |
| 5.8783 | 2.536 |
| 5.876 | 2.534 |
| 5.8742 | 2.533 |
| 5.8722 | 2.532 |
| 5.8701 | 2.530 |
| 5.8681 | 2.529 |
| 5.8660 | 2.526 |
| 5.8640 | 2.523 |
| 5.8621 | 2.521 |
| 5.8602 | 2.518 |
| 5.8582 | 2.515 |
| 5.8563 | 2.513 |
| 5.8544 | 2.511 |
| 5.8525 | 2.509 |
| 5.8506 | 2.507 |
| 5.8488 | 2.505 |
| 5.8469 | 2.502 |
| 5.8449 | 2.501 |
| 5.8430 | 2.500 |

| LUT2 | | |
|---|---|---|
| SOC[%] | CCV[V] | OCV[V] |
| 5.8811 | 3.3463 | 3.4262 |
| 5.8784 | 3.3462 | 3.4258 |
| 5.8783 | 3.3443 | 3.4239 |
| 5.876 | 3.3441 | 3.4237 |
| 5.8742 | 3.3439 | 3.4236 |
| 5.8722 | 3.3436 | 3.4233 |
| 5.8701 | 3.3431 | 3.4232 |
| 5.8681 | 3.3428 | 3.4229 |
| 5.8660 | 3.3425 | 3.4228 |
| 5.8640 | 3.3421 | 3.4227 |
| 5.8621 | 3.3420 | 3.4226 |
| 5.8602 | 3.3417 | 3.4225 |
| 5.8582 | 3.3414 | 3.4224 |
| 5.8563 | 3.3412 | 3.4223 |
| 5.8544 | 3.3411 | 3.4222 |
| 5.8525 | 3.3407 | 3.4221 |
| 5.8506 | 3.3403 | 3.4220 |
| 5.8488 | 3.3401 | 3.4219 |
| 5.8469 | 3.3394 | 3.4218 |
| 5.8449 | 3.3386 | 3.4217 |
| 5.8430 | 3.3381 | 3.4216 |

| LUT3 | |
|---|---|
| USE PERIOD [year] | RESISTANCE INCREASE RATE [%] |
| 0 | 0 |
| 1 | 5 |
| 2 | 11 |
| ⋮ | ⋮ |
| 7 | 20 |
| 8 | 22 |
| ⋮ | ⋮ |
| 20 | 28 |
| ⋮ | ⋮ |

LUT4

| OVERHEATING FREQUENCY PER UNIT PERIOD | COMPENSATION FACTOR |
|---|---|
| 0~0.3 | 1 |
| 0.3~0.6 | 1.1 |
| 0.6~1.0 | 1.2 |
| ⋮ | ⋮ |
| 2.0~2.2 | 1.5 |
| 2.2~2.5 | 1.6 |
| ⋮ | ⋮ |
| 3.1~3.4 | 2.0 |
| ⋮ | ⋮ |

| LUT1 | | LUT2 | | | LUT3 | | LUT4 | |
|---|---|---|---|---|---|---|---|---|
| SOC[%] | OCV[V] | SOC[%] | CCV[V] | OCV[V] | USE PERIOD [year] | RESISTANCE INCREASE RATE [%] | OVERHEATING FREQUENCY PER UNIT PERIOD | COMPENSATION FACTOR |
| 5.8811 | 2.538 | 5.8811 | 3.3463 | 3.4262 | 0 | 0 | 0~0.3 | 1 |
| 5.8784 | 2.537 | 5.8784 | 3.3462 | 3.4258 | 1 | 5 | 0.3~0.6 | 1.1 |
| 5.8783 | 2.536 | 5.8783 | 3.3443 | 3.4239 | 2 | 11 | 0.6~1.0 | 1.2 |
| 5.876 | 2.534 | 5.876 | 3.3441 | 3.4237 | : | : | : | : |
| 5.8742 | 2.533 | 5.8742 | 3.3439 | 3.4236 | 7 | 20 | 2.0~2.2 | 1.5 |
| 5.8722 | 2.532 | 5.8722 | 3.3436 | 3.4233 | 8 | 22 | 2.2~2.5 | 1.6 |
| 5.8701 | 2.530 | 5.8701 | 3.3431 | 3.4232 | : | : | : | : |
| 5.8681 | 2.529 | 5.8681 | 3.3428 | 3.4229 | 20 | 28 | 3.1~3.4 | 2.0 |
| 5.8660 | 2.526 | 5.8660 | 3.3425 | 3.4228 | : | : | : | : |
| 5.8640 | 2.523 | 5.8640 | 3.3421 | 3.4227 | | | | |
| 5.8621 | 2.521 | 5.8621 | 3.3420 | 3.4226 | | | | |
| 5.8602 | 2.518 | 5.8602 | 3.3417 | 3.4225 | | | | |
| 5.8582 | 2.515 | 5.8582 | 3.3414 | 3.4224 | | | | |
| 5.8563 | 2.513 | 5.8563 | 3.3412 | 3.4223 | | | | |
| 5.8544 | 2.511 | 5.8544 | 3.3411 | 3.4222 | | | | |
| 5.8525 | 2.509 | 5.8525 | 3.3407 | 3.4221 | | | | |
| 5.8506 | 2.507 | 5.8506 | 3.3403 | 3.4220 | | | | |
| 5.8488 | 2.505 | 5.8488 | 3.3401 | 3.4219 | | | | |
| 5.8469 | 2.502 | 5.8469 | 3.3394 | 3.4218 | | | | |
| 5.8449 | 2.501 | 5.8449 | 3.3386 | 3.4217 | | | | |
| 5.8430 | 2.500 | 5.8430 | 3.3381 | 3.4216 | | | | |

FIG. 9

BATTERY TESTING APPARATUS AND METHOD

CROSS-REFERENCE TO RELATED APPLICATIONS

The present application claims priority to Korean Patent Application No. 10-2016-0119292 filed on Sep. 19, 2016 in the Republic of Korea, the disclosures of which are incorporated herein by reference.

BACKGROUND

Technical Field

The present disclosure relates to a battery testing apparatus and method, and more particularly, to an apparatus and method for predicting the performance of a battery in the future according to the degradation of the battery.

Description of Related Art

In recent years, demand for portable electronic products such as notebook computers, video cameras, portable telephones and the like has been drastically increased and electric vehicles, storage batteries for energy storage, robots, satellites and the like have been actively developed. For this reason, high performance batteries capable of repeated charge and discharge have been actively studied.

Batteries currently commercially available include nickel-cadmium batteries, nickel-hydrogen batteries, nickel-zinc batteries and lithium ion batteries. Among them, the lithium ion batteries are in the spotlight because they have almost no memory effect compared to nickel-based batteries, and thus perform charge and discharge freely, have very low self-discharge rate and have high energy density.

Therefore, in order to use a battery as long as possible, it is necessary to protect the battery from situations that accelerate deterioration of the service life of the battery, such as overcooling, overheating, overcharging and overdischarging. For this, a charging upper limit voltage, a lower limit voltage or the like are set to a battery management system (BMS). The lower limit voltage may be referred to as a final voltage. For example, when a terminal voltage of a battery reaches the final voltage, the BMS may block a current path connected to the battery, thereby controlling the battery not to be discharged further.

However, due to the self-discharging and/or the increase of the number of charging/discharging cycles, the battery is subjected to irreversible loss of chemical substances involved in electrochemical reactions, namely degradation, which leads to two main phenomena. One of them is an increase in internal resistance, and the other is a decrease in real capacity.

In particular, as a real internal resistance of the battery gradually increases from an initial internal resistance immediately after manufacture, the final voltage also increases. In detail, while the battery is at the beginning of life (BOL), the difference between the real final voltage and the initial final voltage of the battery is as small as negligible, but as the battery comes to the middle of life (MOL), the difference becomes so large that it should not be ignored anymore.

Therefore, it is necessary to adjust the final voltage appropriately according to the degradation degree of the battery. For this purpose, it may be considered to record the final voltage periodically while increasing a cycle count until the battery reaches its end of life, and then use the result to predict a final voltage of a battery of the same specification. At this time, the cycle count of the battery, which is an indicator representing charging/discharging frequency, may be increased by 1 whenever the battery is discharged as much as a design capacity.

However, the above method requires a real charging/discharging experiment, which demands a long time, and a large amount of power is consumed for the experiment. For example, if an experiment is performed to increase a cycle count of a battery with a design capacity of 2000 mAh by 200 per year, 5 years is required to determine a final voltage when the cycle count reaches 1000. Even though the experiment conditions are adjusted, the experiment takes a considerable amount of time, and also electric energy corresponding to about 2000 Ah is wasted to charge the battery 1000 times.

SUMMARY

Technical Problem

The present disclosure is designed to solve the problems of the related art, and therefore the present disclosure is directed to providing an apparatus and method for predicting the performance of a battery at specific date in the future, based on a result of a real test conducted on the battery at the beginning of life.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

The followings are various embodiments of the present disclosure to accomplish the above object.

In one aspect of the present disclosure, there is provided a battery testing apparatus, comprising: a memory unit configured to store profile data of a battery; an interface unit configured to receive a signal designating specific date in the future at which a lowest SOC according to degradation of the battery is to be predicted, the specific date being a time point after the beginning of life of the battery; and a processor connected to the memory unit and the interface unit to communicate therewith. The profile data includes a first look-up table in which open circuit voltages measured in advance for each SOC from the battery in the beginning of life are recorded; a second look-up table in which closed circuit voltages and open circuit voltages obtained for each SOC from an equivalent circuit of the battery in the beginning of life are recorded; and a third look-up table in which a resistance increase rate predetermined for each use period is recorded. The processor predicts the lowest SOC at the specific date according to the degradation of the battery with reference to the first look-up table, the second look-up table and the third look-up table.

The processor may perform: selecting a first SOC associated with a first open circuit voltage corresponding to a predetermined initial final voltage, with reference to the first look-up table, selecting a closed circuit voltage and a second open circuit voltage associated with the first SOC, with reference to the second look-up table, selecting a resistance increase rate associated with a use period corresponding to the specific date, with reference to the third look-up table, and predicting the lowest SOC at the specific date according to the degradation of the battery, based on the closed circuit voltage, the second open circuit voltage and the resistance increase rate.

In addition, the processor may perform calculating a voltage increase amount corresponding to a difference between the closed circuit voltage and the second open circuit voltage, by using the resistance increase rate, calculating a third open circuit voltage corresponding to a sum of the voltage increase amount and the second open circuit voltage, selecting a second SOC associated with the third open circuit voltage, with reference to the second look-up table, and setting the second SOC as the lowest SOC at the specific date according to the degradation of the battery.

In addition, the processor may calculate the third open circuit voltage by using Equation 1 below:

$$OCV_{sim\_2} = \Delta V + OCV_{sim\_1} = \{(OCV_{sim\_1} - CCV_{sim}) \times \Delta R_{D\_S}\} + OCV_{sim\_1} \quad \text{Equation 1}$$

where $CCV_{sim}$ represents the closed circuit voltage, $OCV_{sim\_1}$ represents the second open circuit voltage, $\Delta R_{D\_S}$ represents the resistance increase rate, $\Delta V$ represents the voltage increase amount, and $OCV_{sim\_2}$ represents the third open circuit voltage.

In addition, the processor may perform calculating a compensation factor corresponding to a use history of the battery during a predetermined period in the past, and calculating the voltage increase amount by further using the compensation factor together with the resistance increase rate.

At this time, the use history may include occurrence frequency or retention time of at least one of overcooling, overheating, overcharging and overdischarging.

In addition, the processor may calculate the third open circuit voltage by using Equation 2 below:

$$OCV_{sim\_2} = \Delta V + OCV_{sim\_1} = \{(OCV_{sim\_1} - CCV_{sim}) \times \Delta R_{D\_S} \times F_C\} + OCV_{sim\_1} \quad \text{Equation 2}$$

where $CCV_{sim}$ represents the closed circuit voltage, $OCV_{sim\_1}$ represents the second open circuit voltage, $\Delta R_{D\_S}$ represents the resistance increase rate, $\Delta V$ represents the voltage increase amount, $F_C$ represents the compensation factor, and $OCV_{sim\_2}$ represents the third open circuit voltage.

In addition, the processor may perform selecting a fourth open circuit voltage associated with the lowest SOC at the specific date, with reference to the first look-up table, and setting the fourth open circuit voltage as a final voltage at the specific date according to the degradation of the battery.

In another aspect of the present disclosure, there is also provided a battery testing method, comprising: storing profile data of a battery; receiving a signal designating specific date in the future at which a lowest SOC according to degradation of the battery is to be predicted, the specific date being a time point after the beginning of life of the battery; and predicting the lowest SOC at the specific date according to the degradation of the battery. At this time, the profile data includes a first look-up table in which open circuit voltages measured in advance for each SOC from the battery in the beginning of life are recorded; a second look-up table in which closed circuit voltages and open circuit voltages obtained for each SOC from an equivalent circuit of the battery in the beginning of life are recorded; and a third look-up table in which a resistance increase rate predetermined for each use period is recorded.

In addition, the step of predicting the lowest SOC at the specific date may include: selecting a first SOC associated with a first open circuit voltage corresponding to a predetermined initial final voltage, with reference to the first look-up table, selecting a closed circuit voltage and a second open circuit voltage associated with the first SOC, with reference to the second look-up table, selecting a resistance increase rate associated with a use period corresponding to the specific date, with reference to the third look-up table, calculating a voltage increase amount corresponding to a difference between the closed circuit voltage and the second open circuit voltage, by using the resistance increase rate, calculating a third open circuit voltage corresponding to a sum of the voltage increase amount and the second open circuit voltage, selecting a second SOC associated with the third open circuit voltage, with reference to the second look-up table, and setting the second SOC as the lowest SOC at the specific date according to the degradation of the battery.

In addition, the step of calculating the third open circuit voltage may use Equation 1 below:

$$OCV_{sim\_2} = \Delta V + OCV_{sim\_1} = \{(OCV_{sim\_1} - CCV_{sim}) \times \Delta R_{D\_S}\} + OCV_{sim\_1} \quad \text{Equation 1}$$

where $CCV_{sim}$ represents the closed circuit voltage, $OCV_{sim\_1}$ represents the second open circuit voltage, $\Delta R_{D\_S}$ represents the resistance increase rate, $\Delta V$ represents the voltage increase amount, and $OCV_{sim\_2}$ represents the third open circuit voltage.

In addition, the battery testing method may further comprise: calculating a compensation factor corresponding to a use history of the battery during a predetermined period in the past. In this case, in the step of calculating the voltage increase amount, the voltage increase amount corresponding to the difference between the closed circuit voltage and the second open circuit voltage may be calculated by further using the compensation factor together with the resistance increase rate.

In addition, the step of calculating the third open circuit voltage may use Equation 1 below:

$$OCV_{sim\_2} = \Delta V + OCV_{sim\_1} = \{(OCV_{sim\_1} - CCV_{sim}) \times \Delta R_{D\_S} \times F_C\} + OCV_{sim\_1} \quad \text{Equation 2}$$

where $CCV_{sim}$ represents the closed circuit voltage, $OCV_{sim\_1}$ represents the second open circuit voltage, $\Delta R_{D\_S}$ represents the resistance increase rate, $\Delta V$ represents the voltage increase amount, $F_C$ represents the compensation factor, and $OCV_{sim\_2}$ represents the third open circuit voltage.

Advantageous Effects

According to any one of the embodiments of the present disclosure, it is possible to predict the performance of a battery at specific date in the future, based on a result of a real test conducted on the battery at the beginning of life.

The effects of the present disclosure are not limited to the effects mentioned above, and other effects not mentioned herein may be clearly understood from the appended claims by those skilled in the art.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is judged that detailed explanation on a known technique or configuration may unnecessarily make the essence of the present disclosure vague, the detailed explanation will be omitted.

Throughout the specification, when a portion is referred to as "comprising" or "including" any element, it means that the portion may include other elements further, not excluding other elements unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a battery testing apparatus and method according to an embodiment of the present disclosure will be described in detail.

Figure 1:
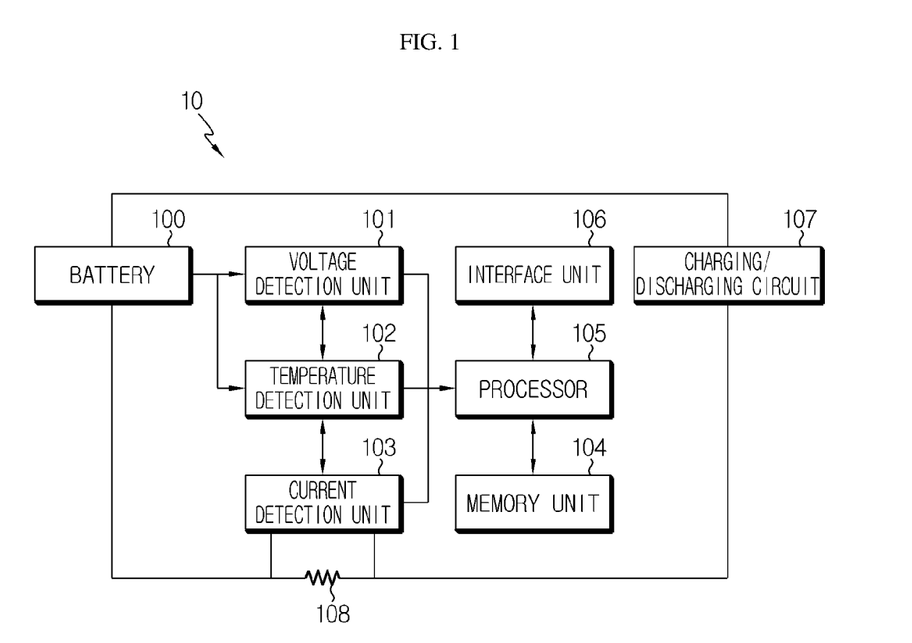
FIG. 1 is a block diagram showing a battery testing apparatus according to an embodiment of the present disclosure.

FIG. 1 is a block diagram showing a battery testing apparatus 10 according to an embodiment of the present disclosure.

Referring to FIG. 1, the testing apparatus 10 may include a voltage detection unit 101, a temperature detection unit 102, a current detection unit 103, a memory unit 104, a processor 105, an interface unit 106, a charging/discharging circuit 107 and a current detection resistor 108. At this time, both ends of the battery 100 may be connected to the charging/discharging circuit 107.

The voltage detection unit 101 periodically measures a terminal voltage of a battery as a response to an instruction of the processor 105 and outputs the terminal voltage to the processor 105. The voltage detection unit 101 includes a voltage measuring circuit for measuring the terminal voltage of the battery. The voltage measuring circuit uses a circuit known in the art.

The temperature detection unit 102 periodically measures a temperature of the battery as a response to an instruction of the processor 105 and outputs the temperature to the processor 105. The temperature detection unit 102 includes at least one of various temperature measurement elements known in the art.

The current detection unit 103 periodically measures a current flowing through the current detection resistor 108 as a response to an instruction of the processor 105 and outputs the current to the processor 105. The current measured by the current detection unit 103 is a charging current or a discharging current.

The memory unit 104 may store voltage data, temperature data and current data of the battery, measured by the voltage detection unit 101, the temperature detection unit 102 and the current detection unit 103.

In addition, the memory unit 104 stores various look-up tables, explained later. Further, the memory unit 104 stores programs required for operating the processor 105, various calculation results generated during a process of predicting performance according to the degradation of the battery, and data required in advance. The memory 104 may be implemented in hardware to include at least one storage medium among a flash memory type, a hard disk type, a solid state disk (SSD) type, a silicon disk drive (SDD) type, a multimedia card micro type, a random access memory (RAM) type, a static random access memory (SRAM) type, a read-only memory (ROM) type, an electrically erasable programmable read-only memory (EEPROM) type, and a programmable read-only memory (PROM).

The interface unit 106 may be electrically connected to the processor 105 to output information corresponding to the signal provided from the processor 105 visually and/or audibly. For this, the interface unit 106 may include a display device and/or an audio device.

In addition, the interface unit 106 includes an input device for receiving an instruction from a user. For example, a keyboard, a touch screen, a microphone, a camera or the like may be used as the input device. The input device may receive a signal for designating specific date in the future at which the performance according to the degradation of the battery is to be predicted, from the user.

The processor 105 may store the data representing voltage, temperature and current, periodically measured by controlling the voltage detection unit 101, the temperature detection unit 102 and the current detection unit 103, in the memory unit 104. The processor 105 includes a real time clock (RTC) to measure time during which at least one of the voltage, temperature and current measured from the battery 100 deviates from a suitable range predetermined in association with it, and the measured time may be recorded in the memory unit 104.

In addition, the processor 105 may control the charging/discharging circuit 107 so that the battery 100 is charged or discharged in a predetermined way. For example, the processor 105 may control the charging/discharging circuit 107 to supply a constant current of 0.5 C to the battery 100.

Also, the processor 105 stores various calculation results, generated during the performance prediction process of the battery 100 at the specific date transmitted from the interface unit 106, in the memory unit 104.

Moreover, the processor 105 outputs information representing the predicted performance of the battery to the outside through the interface unit 106 visually and/or audibly.

The processor 105 may be implemented in hardware by using at least one of application specific integrated circuits (ASICs), digital signal processors (DSPs), digital signal processing devices (DSPDs), programmable logic devices (PLDs), field programmable gate arrays (FPGAs), processors, micro-controllers, and other electric units for performing other functions.

The battery 100 is not specially limited to any kind and may employ a rechargeable lithium-ion battery, a lithium polymer battery, a nickel cadmium battery, a nickel hydrogen battery, a nickel zinc battery or the like.

Meanwhile, among the components depicted in FIG. 1, components other than the memory unit 104, the processor 105 and the interface unit 106 may be excluded from the testing apparatus 10.

Figure 2:
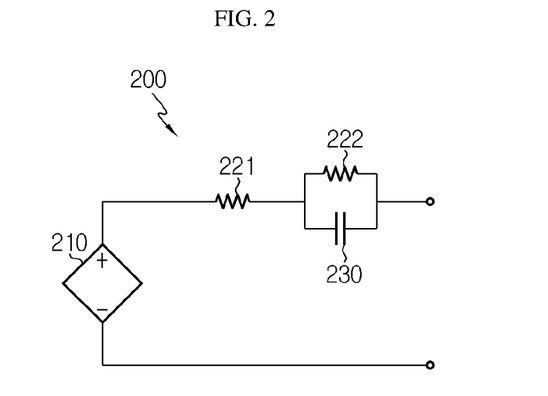
FIG. 2 shows an exemplarity equivalent circuit modeled to simulate electrochemical characteristics of a battery according to an embodiment of the present disclosure.

FIG. 2 shows an exemplarity equivalent circuit 200 modeled to simulate electrochemical characteristics of the battery 100 according to an embodiment of the present disclosure.

Referring to FIG. 2, the equivalent circuit 200 is modeled to simulate electrochemical characteristics of the battery 100 in the beginning of life (BOL) and may be configured to basically include a voltage source 210, a first resistor 221, a second resistor 222 and a capacitor 230.

In detail, the voltage source 210 represents an open circuit voltage (OCV) of the battery 100, and the first resistor 221 represents resistance corresponding to the internal resistance of the battery 100. In addition, the second resistor 222 and the capacitor 230 may be connected in parallel to represent diffusion resistance and diffusion capacitance according to charging/discharging of the battery 100, respectively. The voltage of the voltage source 210 may be changed nonlinearly according to a SOC. In addition, the resistance of the first resistor 221, the resistance of the second resistor 222 and the capacitance of the capacitor 230 are changed according to the SOC.

Data, programs and various variables demanded for the simulation of the equivalent circuit 200 depicted in FIG. 2 may be stored in the memory unit 104 in advance before performing the performance prediction process, explained later.

The equivalent circuit modeled to simulate electrochemical characteristics of the battery 100 is not limited to the structure depicted in FIG. 2 and may be modified in various ways as obvious to those skilled in the art.

Figure 3:
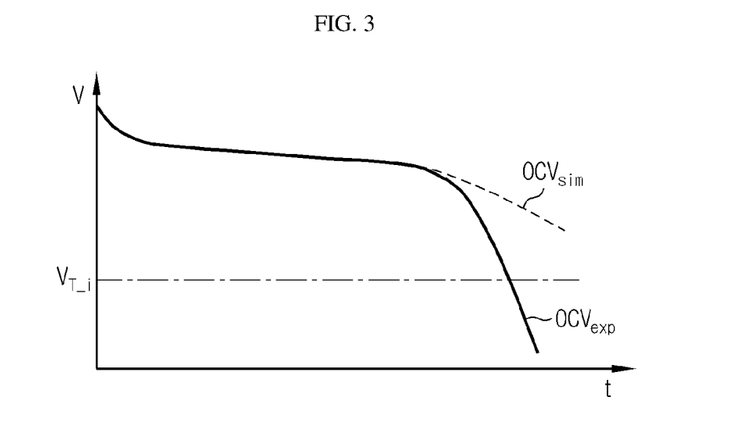
FIG. 3 shows an open circuit voltage profile in a simplified way, which is referenced in describing operations of the testing apparatus according to an embodiment of the present disclosure.

FIG. 3 shows an open circuit voltage profile in a simplified way, which is referenced in describing operations of the testing apparatus 10 according to an embodiment of the present disclosure. In FIG. 3, the open circuit voltage profile of the battery 100 is related to the beginning of life. In the present disclosure, if the battery 100 is in the beginning of life, this means that the cycle count does not yet reaches a predetermined value (for example, 200). For example, a state where the cycle count is in the range of 0 to 199 may be classified into the beginning of life, a state where the cycle count in the range of 200 to 799 may be classified into the middle of life (MOL), and a state where the cycle count is 800 or greater may be classified into the end of life (EOL).

The cycle count for distinguishing the beginning of life, the middle of life and the end of life may also be suitably determined depending on specifications and/or environments of the battery 100.

Referring to FIG. 3, when the battery is discharged at a predetermined current rate (for example, 0.5 C), an open circuit voltage profile ($OCV_{exp}$) of the battery 100 and an open circuit voltage profile ($OCV_{sim}$) of the equivalent circuit 200 according to time may be checked. Here, the open circuit voltage profile ($OCV_{exp}$) of the battery 100 is actually measured from the battery 100, and the open circuit voltage profile ($OCV_{sim}$) of the equivalent circuit 200 is obtained through simulation.

First, seeing the open circuit voltage profile ($OCV_{exp}$) of the battery 100, an abrupt voltage drop occurs near an initial final voltage ($V_{T\_i}$). The initial final voltage means a final voltage when the battery 100 is in the beginning of life, and data representing the initial final voltage may be stored in the memory unit 104 in advance.

On the contrary, the open circuit voltage profile ($OCV_{sim}$) of the equivalent circuit 200 shows relatively small voltage drops before and after the voltage of the battery 100 reaches the initial final voltage ($V_{T\_i}$). This is because the equivalent circuit 200 does not perfectly simulate real electrochemical characteristics of the battery 100. If the equivalent circuit 200 is modeled more precisely, the electrochemical characteristics of the battery 100 may be simulated more closely, but the circuit modeling becomes complicated to increase the calculating amount excessively and demand additional time and costs.

Thus, the inventor of the present disclosure is to provide a method for predicting the performance of a battery 100 beyond the beginning of life (namely, a degraded battery), based on relationship between the battery 100 in the beginning of life and the equivalent circuit 200.

Figure 4:
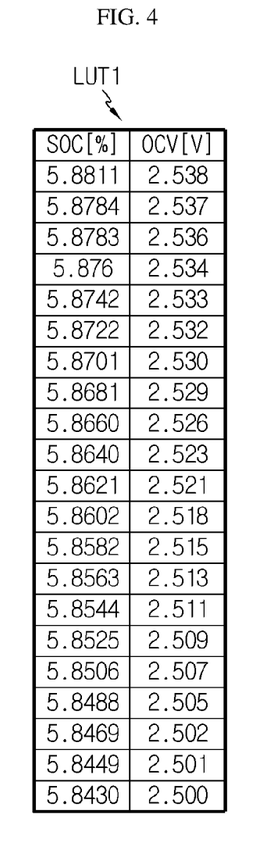
FIGS. 4 to 6 exemplarily show look-up tables which are utilized to predict the performance according to the degradation of the battery by the testing apparatus according to an embodiment of the present disclosure.
Figure 5:
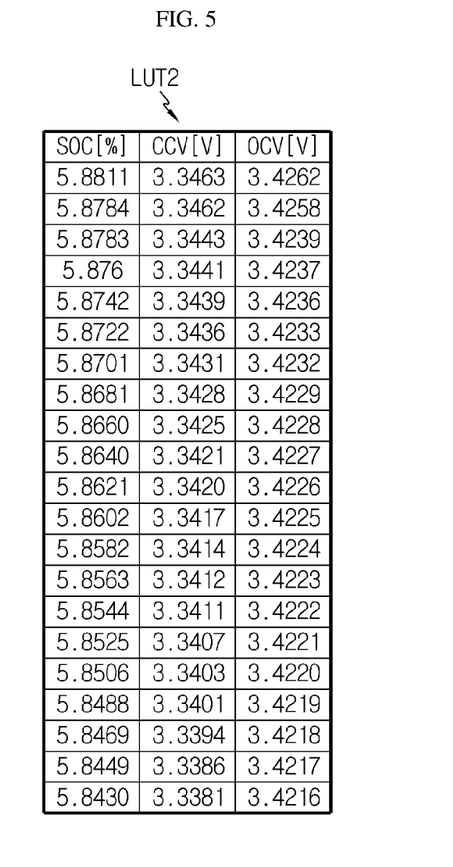
Figure 6:
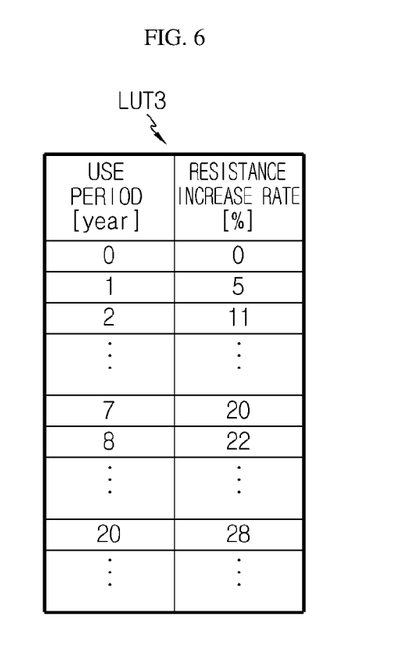

FIGS. 4 to 6 exemplarily show look-up tables which are utilized to predict the performance according to the degradation of the battery 100 by the testing apparatus 10 according to an embodiment of the present disclosure.

FIG. 4 exemplarily shows a first look-up table LUT1. The first look-up table LUT1 has a data structure in which open circuit voltages measured from the battery 100 in the beginning of life for each SOC in advance are recorded. In other words, the first look-up table LUT1 defines an OCV-SOC curve of the battery 100 in the beginning of life. Here, OCV is an abbreviation of open circuit voltage and means an open circuit voltage.

SOC (State of Charge) represents a charging state of the battery 100 and may also represent a residual capacity at the present in comparison to a design capacity, expressed by %. For example, if the design capacity is 2000 mAh and the residual capacity is 1000 mAh, the SOC of the battery 100 will be calculated as 50%.

The processor 105 may obtain SOC associated with a specific open circuit voltage or obtain an open circuit voltage associated with a specific SOC, with reference to the first look-up table LUT1. At this time, the initial final voltage may be included between a maximum value and a minimum value of the open circuit voltage recorded in the first look-up table LUT1.

The processor 105 may calculates SOC of the battery 100 based on the voltage, current and temperature of the battery 100 and store the calculated SOC in the memory unit 104 in association with an open circuit voltage corresponding thereto. Various SOC estimating methods are known in the art, and thus this will not be described in detail here.

FIG. 5 exemplarily shows a second look-up table LUT2. The second look-up table LUT2 has a data structure in which open circuit voltages obtained for each SOC from the equivalent circuit 200 as shown in FIG. 2 are recorded. In other words, the second look-up table LUT2 defines an OCV-SOC curve of the equivalent circuit 200. Similar to the first look-up table LUT1, the processor 105 may obtain SOC associated with each open circuit voltage or obtain an open circuit voltage associated with each SOC, with reference to the second look-up table LUT2.

Though not shown in the figures, in the second look-up table LUT2, closed circuit voltages (CCV) obtained from the equivalent circuit 200 for each SOC may be further recorded. In this case, the second look-up table LUT2 may define not only the OCV-SOC curve of the equivalent circuit 200 but also a CCV-SOC curve. A difference between CCV and OCV for the same SOC is generated due to an IR drop caused by the resistors 221, 222 included in the equivalent circuit 200. When discharging is performed as shown in FIG. 3, it is obvious that OCV is greater than CCV at each SOC, and thus this will not be described in detail here.

FIG. 6 exemplarily shows a third look-up table LUT3. The third look-up table LUT3 has a data structure in which a resistance increase rate predetermined for each use period is recorded. As described above, as the battery 100 is degraded, its internal resistance gradually increases from the initial resistance. The initial resistance may represent an internal resistance immediately after the battery 100 is manufactured.

In addition, the degradation of the battery 100 is caused by repeated charging and discharging. Thus, under the predetermined experiment environment in which general use conditions of the battery 100 are settled, the internal resistance may be measured while increasing a cycle count of a battery 100 having the same specification as the battery 100 and record the measured internal resistance in association with the cycle count. Alternatively, the resistance increase rate of each use period may be suitably determined by a user, instead of prior experiments.

The resistance increase rate is a value representing a relative proportion of the internal resistance in comparison to the initial resistance and may be calculated using Equation 1 below.

$$\Delta R_{D\_S} = (R_S - R_i)/R_i \times 100[\%]$$  Equation 1

In Equation 1, $R_1$ represents initial resistance, $R_S$ represents internal resistance, and $\Delta R_{D\_S}$ represents a resistance increase rate. For example, if $\Delta R_D$ s is 20%, this means that the internal resistance becomes 1.2 times of the initial resistance due to the degradation of the battery 100. A method for measuring the internal resistance is widely known in the art and thus will not be described in detail here.

At this time, if an average charging/discharging frequency per unit period is determined in advance, the cycle count may be converted into a use period. For example, if it is determined that the cycle count increases by 100 per one year, it may be expected that the cycle count would be 700 when the use period of the battery 100 reaches 7 years. In addition, since the internal resistance at each cycle count is already known through the prior experiments, it is possible to generate the third look-up table LUT3 in which a relation between various use periods of the battery 100 and the resistance increase rate is defined.

Though FIG. 6 illustrates that the use period is classified in the unit of year, the present disclosure is not limited thereto, and it will be easily understood by those skilled in the art that the use period can be classified in more detail, for example in the unit of month, day, time, minute or second.

Meanwhile, the look-up tables depicted in FIGS. 4 to 6 are stored in advance in the memory unit 104 before the process of predicting the performance at a specific date according to the degradation of the battery 100 is performed.

Figure 7:
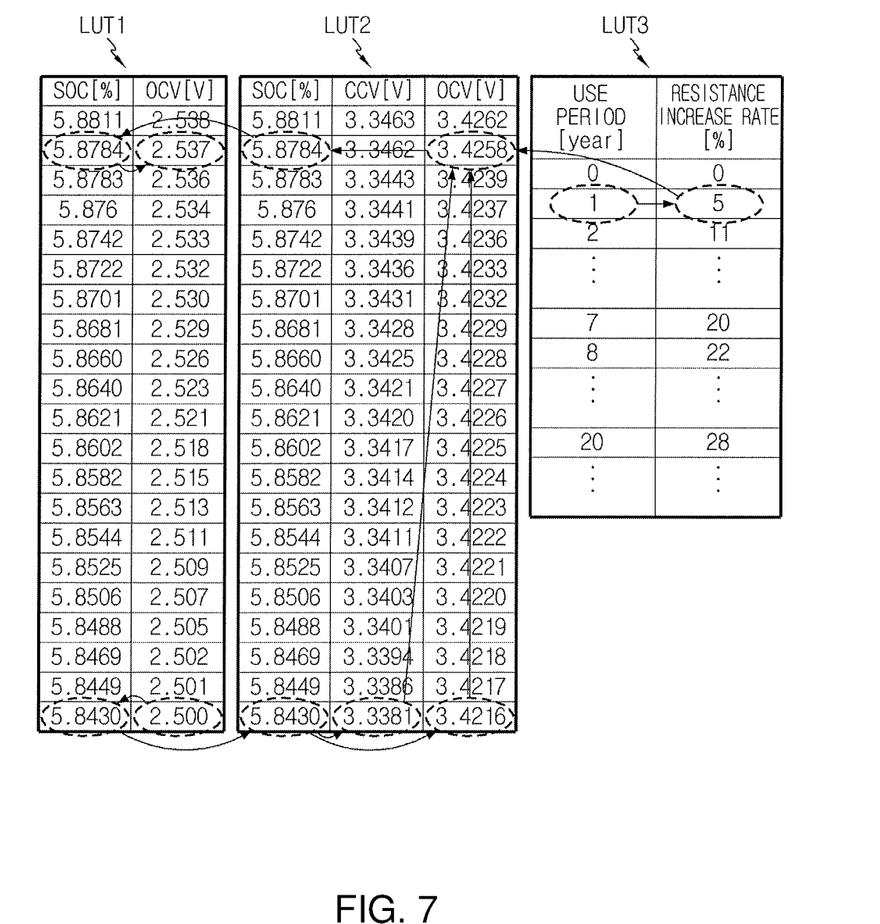
FIG. 7 is a diagram which is referenced in describing an operation of predicting the performance according to the degradation of the battery by the testing apparatus according to an embodiment of the present disclosure.

FIG. 7 is a diagram which is referenced in describing an operation of predicting the performance according to the degradation of the battery 100 by the testing apparatus 10 according to an embodiment of the present disclosure.

Referring to FIGS. 1 and 7, first, the processor 105 receives a signal designating specific date in the future at which performance (for example, a lowest SOC) according to degradation of the battery 100 is to be predicted, through the interface unit 106.

The processor 105 loads the first look-up table LUT1 from the memory unit 104. The processor 105 selects SOC associated with a first open circuit voltage corresponding to the initial final voltage of the battery 100, with reference to the loaded first look-up table LUT1. Hereinafter, the initial final voltage is assumed as 2.500V.

The processor 105 searches OCVs of the first look-up table LUT1 and selects 5.8430% which is SOC associated with the first open circuit voltage closest to 2.5000V which is the initial final voltage. At this time, it may be understood that SOC of 5.8430% selected from the first look-up table LUT1 represents the lowest SOC of the battery 100 in the beginning of life.

Next, the processor 105 loads the second look-up table LUT2 from the memory unit 104. The processor 105 selects the closed circuit voltage of 3.3381V and the second open circuit voltage of 3.4216V associated with 5.8430% which is SOC selected from the first look-up table LUT1, with reference to the loaded second look-up table LUT2.

In addition, the processor 105 loads the third look-up table LUT3 from the memory unit 104. The processor 105 selects a resistance increase rate associated with any one use period corresponding to the specific date, with reference to the loaded third look-up table LUT3. For example, if the manufacture date of the battery 100 is Jan. 1, 2016 and the specific date is Jan. 1, 2017, a difference between the specific date and the manufacture date is 1 year, and thus the processor 105 may select 5% which is a resistance increase rate associated with the use period of 1 year.

After that, the lowest SOC at the specific date may be predicted based on the closed circuit voltage of 3.3381V and the second open circuit voltage of 3.4216V, selected from the second look-up table LUT2, and the resistance increase rate of 5%, selected from the third look-up table LUT2.

The processor 105 may calculate a voltage increase amount corresponding to the difference between the closed circuit voltage of 3.3381V and the second open circuit voltage of 3.4216V by using the resistance increase rate of 5%. The voltage increase amount is a parameter for correcting the open circuit voltage profile ($OCV_{sim}$) of the equivalent circuit 200 at least partially as much as an increase amount of the internal resistance in comparison to the initial resistance of the battery 100 and is based on Ohm's law. If the voltage increase amount is completely calculated, the processor 105 may calculate a third open circuit voltage by correcting the second open circuit voltage as much as the voltage increase amount.

For example, the third open circuit voltage may be calculated using Equation 2 below.

$$OCV_{sim\_2} = \Delta V + OCV_{sim\_1} = \{(OCV_{sim\_1} - CCV_{sim}) \times \Delta R_{D\_S}\} + OCV_{sim\_1} \quad \text{Equation 2}$$

$CCV_{sim}$ represents the closed circuit voltage, $OCV_{sim\_1}$ represents the second open circuit voltage, $\Delta R_{D\_S}$ represents the resistance increase rate, $\Delta V$ represents the voltage increase amount, and $OCV_{sim\_2}$ represents the third open circuit voltage.

In the above assumption, $CCV_{sim}=3.3381V$, $OCV_{sim\_1}=3.4216V$, and $\Delta R_{D\_S}=5\%$. If this is applied to Equation 2, $\Delta V=0.0041750.0042V$, and $OCV_{sim}\ 2=\Delta V+OCV_{sim\_1}\approx 3.4258V$.

If the third open circuit voltage is completely calculated, the processor 105 selects SOC associated with the third open circuit voltage of 3.4258V from the second look-up table LUT2. Referring to FIGS. 5 and 7, SOC selected from the second look-up table LUT2 by the processor 105 would be 5.8784%. 5.8784% selected from the second look-up table LUT2 is a value predicted as the lowest SOC at the specific date. This value is increased by about 0.0354% p in comparison to the lowest SOC of 5.8430% in the beginning of life. As described above, if the charging state of the battery 100 reaches the lowest SOC, the BMS blocks a current path of the battery 100. The testing apparatus 10 according to the present disclosure may gradually increase the lowest SOC according to the degradation of the battery 100, and thus it is possible to prevent the battery 100 from being overdischarged and also prevent an abrupt power interruption.

In addition, the testing apparatus 10 may set a fourth open circuit voltage of 2.537V associated with 5.8784% predicted as the lowest SOC at the specific date as a final voltage at the specific date, with reference to the first look-up table LUT1. This value is increased by about 0.037V in comparison to the initial final voltage of 2.5000V, which reveals that the internal resistance is increased according to the degradation of the battery 100.

Figure 8:
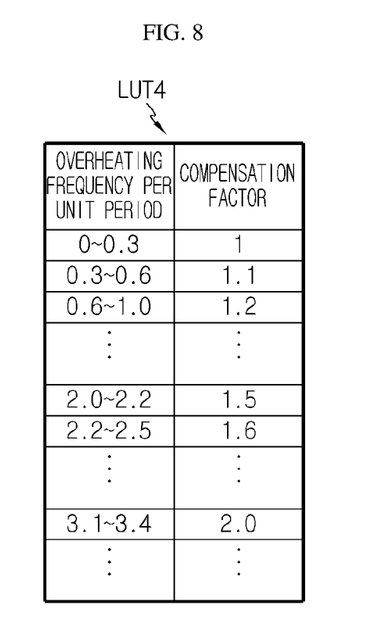
FIGS. 8 and 9 are diagrams which are referenced in describing an operation of predicting the performance according to the degradation of the battery by a testing apparatus according to another embodiment of the present disclosure.
Figure 9:
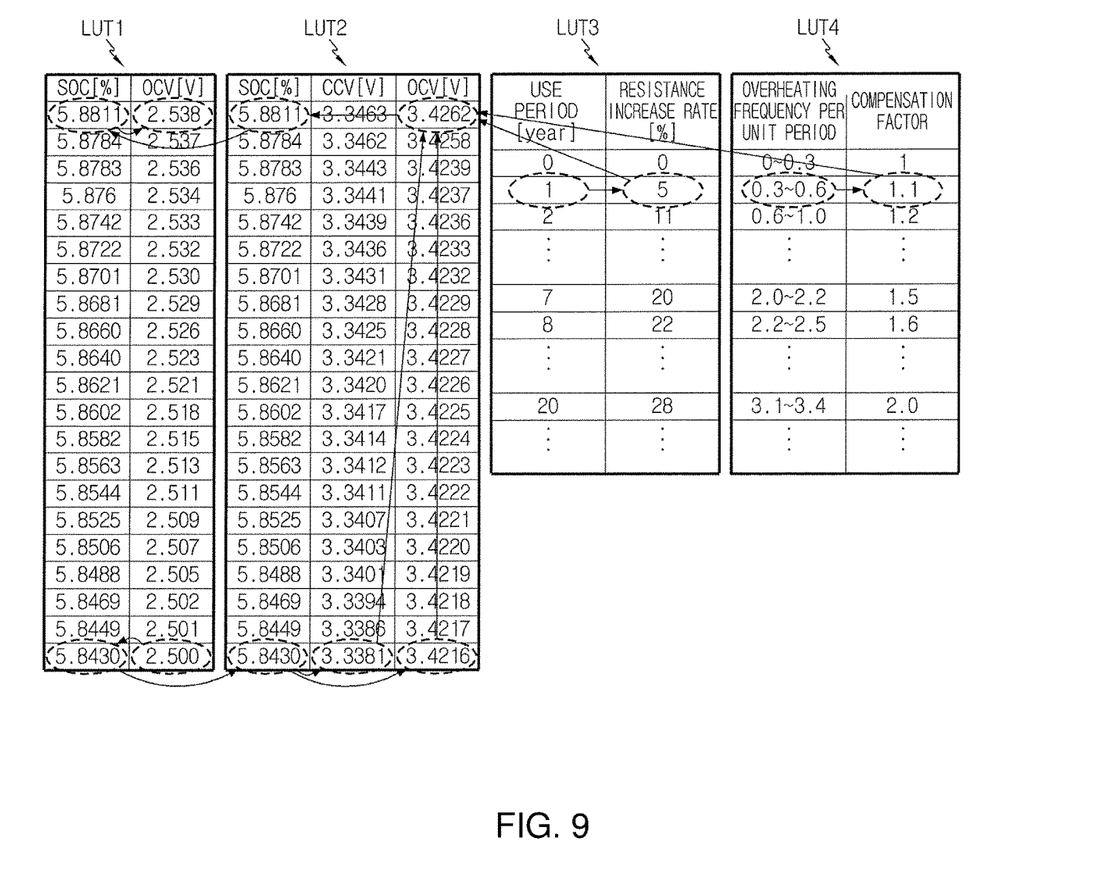

FIGS. 8 and 9 are diagrams which are referenced in describing an operation of predicting the performance according to the degradation of the battery 100 by a testing apparatus 10 according to another embodiment of the present disclosure.

The embodiment illustrated in FIGS. 8 and 9 is different from the former embodiment illustrated in FIG. 7 in the point that the testing apparatus 10 predicts the lowest SOC at the specific date, based on use history of the battery 100 additionally. For better understanding, it is assume that a resistance increase rate, a closed circuit voltage and a second open circuit voltage, used for predicting the lowest SOC at the specific date are identical to those of FIG. 7.

The use history includes occurrence frequency and/or retention time of at least one of overcooling, overheating, overcharging and overdischarging per unit period (for example, one cycle count). For example, if the overheating frequency per 1 cycle is higher, this means that the battery 100 has been used more severely. In another example, if the time during which the overcharging state per 1 cycle is maintained is longer, this means that the battery 100 has been used more severely.

The data defining highest temperature and lowest temperature for determining whether the battery 100 is overcooled or overheated may be stored in the memory unit 104 in advance. In addition, the data defining a final voltage and an upper limit voltage for determining whether the battery 100 is overdischarged or overcharged may also be stored in the memory unit 104 in advance.

At this time, a compensation factor corresponds to use history of the battery 100 in the beginning of life in a predetermined past period and may represent how severely the battery 100 has been used. In other words, if the battery 100 has been used more severely in a predetermined past period, the compensation factor calculated by the processor 105 based on the use history is increased. The memory unit 104 may store a look-up table in which a compensation factor for each use history is recorded.

The processor 105 may calculate a voltage increase amount corresponding to the difference between the closed circuit voltage of 3.3381V and the second open circuit voltage of 3.4216V by additionally using the compensation factor together with the resistance increase rate of 5%.

FIG. 8 exemplarily shows a fourth look-up table LUT4 in which a compensation factor according to an overheating frequency per unit period among the use history is defined. The processor 105 may select a compensation factor corresponding to the overheating frequency of the battery 100 per unit period during a predetermined past period, with reference to the fourth look-up table LUT4. For example, if the overheating frequency per unit period represented by the use history is 0.4, the compensation factor selected from the fourth look-up table LUT4 by the processor 105 would be 1.1.

For example, the third open circuit voltage may be calculated using Equation 3 below.

$$OCV_{sim\_2} = \Delta V + OCV_{sim\_1} = \{(OCV_{sim\_1} - CCV_{sim}) \times \Delta R_{D\_S} \times F_C\} + OCV_{sim\_1} \quad \text{Equation 3}$$

$CCV_{sim}$ represents the closed circuit voltage, $OCV_{sim\_1}$ represents the second open circuit voltage, $\Delta R_{D\_S}$ represents the resistance increase rate, $F_C$ represents the compensation factor, $\Delta V$ represents the voltage increase amount, and $OCV_{sim\_2}$ represents the third open circuit voltage.

In the above assumption, $CCV_{sim}=3.3381V$, $OCV_{sim} 1=3.4216V$, and $\Delta R_{D\_S}=5\%$, $F_C=1.1$. Thus, if they are applied to Equation 3, $\Delta V=0.0045925\approx 0.046V$, and $OCV_{ECM\_2}=\Delta V+OCV_{sim\_1}=3.4261925V\approx 3.4262V$.

If the third open circuit voltage is completely calculated, the processor 105 selects SOC associated with the third open circuit voltage of 3.4262V from the second look-up table LUT2. Referring to FIG. 7, SOC selected from the second look-up table LUT2 by the processor 105 would be 5.8811%.

In other words, SOC of 5.8811% defined in the second look-up table LUT2 as corresponding to the third open circuit voltage of 3.4262V is a predicted value of the lowest SOC at the specific date. This value is increased by about 0.0381% p in comparison to the lowest SOC of 5.8430% in the beginning of life. In addition, this value is increased by about 0.0027% p in comparison to 5.8784% which is SOC predicted when the compensation factor according to the use history is not applied.

In addition, the testing apparatus 10 may set the fourth open circuit voltage of 2.538V associated with the lowest SOC of 5.8811% as a final voltage at the specific date, with reference to the first look-up table LUT1.

Figure 10:
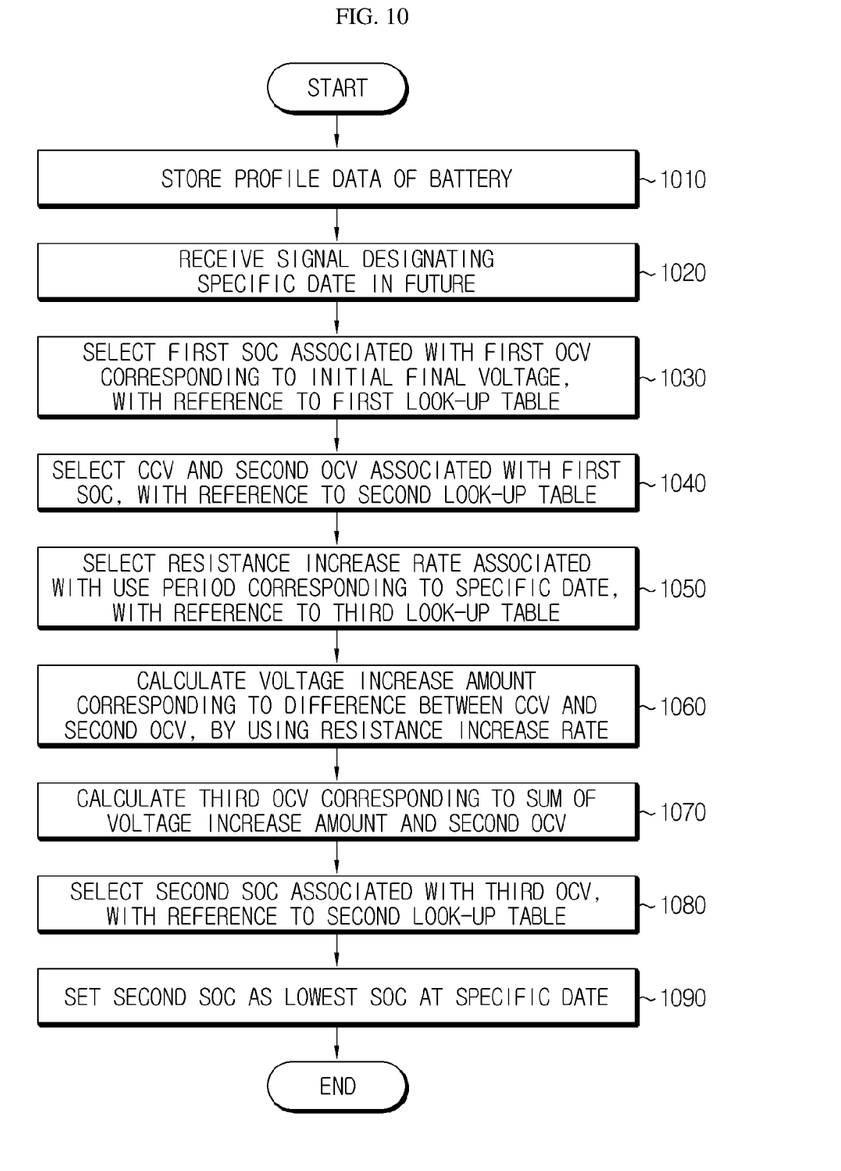
FIG. 10 is a flowchart for illustrating processing steps performed by the testing apparatus according to an embodiment of the present disclosure.

FIG. 10 is a flowchart for illustrating processing steps performed by the testing apparatus 10 according to an embodiment of the present disclosure.

Referring to FIG. 10, in Step 1010, the memory unit 104 stores profile data of the battery 100. In detail, the profile data may be received through the interface unit 106. The profile data may include at least the first look-up table LUT1, the second look-up table LUT2 and the third look-up table LUT3. The processor 105 may control the memory unit 104 to store the profile data received through the interface unit 106.

In Step 1020, the interface unit 106 receives a signal designating specific date in the future at which a lowest SOC according to degradation of the battery 100 is to be predicted. At this time, the specific date is a predetermined point of time after the beginning of life.

In Step 1030, the processor 105 selects a first SOC associated with a first open circuit voltage corresponding to a predetermined initial final voltage, with reference to the first look-up table LUT1.

In Step 1040, the processor 105 selects a closed circuit voltage and a second open circuit voltage associated with the first SOC selected in Step 1030, with reference to the second look-up table LUT2.

In Step 1050, the processor 105 selects a resistance increase rate associated with a use period corresponding to the specific date designated in Step 1020, with reference to the third look-up table LUT3. Meanwhile, though FIG. 10 illustrates that Step 1050 is performed after Step 1030 and Step S1040, the present disclosure is not limited thereto.

In Step 1060, the processor 105 calculates a voltage increase amount corresponding to a difference between the closed circuit voltage and the second open circuit voltage, by using the resistance increase rate selected in Step 1050. The voltage increase amount may be a parameter for correcting the open circuit voltage profile of the equivalent circuit 200 at least partially as much as an increase amount of the internal resistance according to the degradation of the battery 100.

In Step 1070, the processor 105 calculates a third open circuit voltage corresponding to a sum of the voltage increase amount and the second open circuit voltage calculated in Step 1060.

In Step 1080, the processor 105 selects a second SOC associated with the third open circuit voltage, with reference to the second look-up table LUT2.

In Step 1090, the processor 105 sets the second SOC as the lowest SOC at the specific date according to the degradation of the battery 100. In other words, the second SOC is the lowest SOC at the specific date which represents a predicted charging state. The lowest SOC at the specific date predicted using the above process may be notified to a user by using a display device and/or an audio device provided at the interface unit.

The embodiments of the present disclosure described above are not implemented only by an apparatus and method, but may also be implemented through a program realizing functions corresponding to the configuration of the embodiment of the present disclosure or a recording medium on which the program is recorded. These embodiments may be easily implemented from the embodiments by those skilled in the art.

While the present disclosure has been described by way of embodiments and drawings, the present disclosure is not limited thereto but may be changed and modified in various ways by those skilled in the art within the equivalent scope of the appended claims.

In addition, since the present disclosure described above may be replaced, modified and changed in various ways without departing from the technical idea of the present disclosure by those skilled in the art, the present disclosure is not limited to the above embodiments or the accompanying drawings, but all or some of the embodiments may be selectively combined to make various modifications.

REFERENCE SIGNS

10: testing apparatus
101: voltage detection unit
102: temperature detection unit
103: current detection unit
104: memory unit
105: processor
106: interface unit
107: charging/discharging circuit
108: current detection resistor
200: equivalent circuit
210: voltage source
221: first resistor
222: second resistor
230: capacitor
LUT1: first look-up table
LUT2: second look-up table
LUT3: third look-up table
LUT4: fourth look-up table

What is claimed is:

1. A battery testing apparatus, comprising:
a memory configured to store profile data of a battery;
a user interface configured to receive a signal designating a specific future date at which a lowest state of charge (SOC) according to degradation of the battery is to be predicted, the specific future date being a time point after a beginning of life of the battery, wherein the lowest SOC indicates a specific SOC at which a current path connected to the battery is blocked in order to prevent the battery from being overdischarged; and
a processor connected to the memory and the user interface to communicate therewith,
wherein the profile data includes:
  a first look-up table in which respective open circuit voltages of the battery measured in advance for each SOC of the battery in the beginning of life of the battery are recorded;
  a second look-up table in which respective closed circuit voltages of an equivalent circuit of the battery modeled to simulate electrochemical characteristics of the battery in the beginning of life of the battery and respective open circuit voltages of the equivalent circuit of the battery for each SOC of the equivalent circuit of the battery are recorded; and
  a third look-up table in which respective resistance increase rates predetermined for each use period are recorded, wherein each of the resistance increase rates represents a ratio of (i) a difference between an internal resistance of the battery predetermined for each use period and an initial internal resistance of the battery to (ii) the initial internal resistance of the battery, and
wherein the processor is configured to:
  select a first SOC associated with a first open circuit voltage corresponding to a predetermined initial final voltage, with reference to the first look-up table, wherein the first open circuit voltage is one of the respective open circuit voltages of the battery recorded in the first look-up table;
  select a closed circuit voltage and a second open circuit voltage associated with the first SOC, with reference to the second look-up table, wherein the selected closed circuit voltage is one of the respective closed circuit voltages of the battery recorded in the second lookup table, and wherein the second open circuit voltage is one of the respective open circuit voltages of the battery recorded in the second lookup table;

select a resistance increase rate associated with a use period corresponding to the specific future date, with reference to the third look-up table, wherein the selected resistance increase rate is one of the respective resistance increase rates recorded in the third lookup table;

calculate a voltage increase amount corresponding to a difference between the selected closed circuit voltage and the second open circuit voltage, by using the selected resistance increase rate;

calculate a third open circuit voltage corresponding to a sum of the voltage increase amount and the second open circuit voltage;

select a second SOC associated with the third open circuit voltage, with reference to the second look-up table; and set the second SOC as the lowest SOC at the specific future date according to the degradation of the battery.

2. The battery testing apparatus according to claim 1, wherein the processor is configured to calculate the third open circuit voltage according to the following equation:

$$OCV_{sim\_2} = \Delta V + OCV_{sim\_1} = \{(OCV_{sim\_1} - CCV_{sim}) \times \Delta R_{D\_S}\} + OCV_{sim\_1}$$

where $CCV_{sim}$ represents the selected closed circuit voltage, $OCV_{sim\_1}$ represents the second open circuit voltage, $\Delta R_{D\_S}$ represents the selected resistance increase rate, $\Delta V$ represents the voltage increase amount, and $OCV_{sim\_2}$ represents the third open circuit voltage.

3. The battery testing apparatus according to claim 1, wherein the processor is configured to calculate a compensation factor corresponding to a use history of the battery during a predetermined past period of time, and wherein the processor is configured to calculate the voltage increase amount by using the selected resistance increase rate together with the compensation factor.

4. The battery testing apparatus according to claim 3, wherein the use history includes occurrence frequency or retention time of at least one of overcooling, overheating, overcharging and overdischarging.

5. The battery testing apparatus according to claim 3, wherein the processor is configured to calculate the third open circuit voltage according to the following equation:

$$OCV_{sim\_2} = \Delta V + OCV_{sim\_1} = \{(OCV_{sim\_1} - CCV_{sim}) \times \Delta R_{D\_S} \times F_C\} + OCV_{sim\_1}$$

where $CCV_{sim}$ represents the selected closed circuit voltage, $OCV_{sim\_1}$ represents the second open circuit voltage, $\Delta R_{D\_S}$ represents the selected resistance increase rate, $\Delta V$ represents the voltage increase amount, $F_C$ represents the compensation factor, and $OCV_{sim\_2}$ represents the third open circuit voltage.

6. The battery testing apparatus according to claim 1, wherein the processor is configured to:

select a fourth open circuit voltage associated with the lowest SOC at the specific future date, with reference to the first look-up table, wherein the fourth open circuit voltage is another one of the respective open circuit voltages of the battery recorded in the first lookup table; and set the fourth open circuit voltage as a final voltage at the specific future date according to the degradation of the battery.

7. A battery testing method, comprising:

storing profile data of a battery;

receiving a signal designating specific future date at which a lowest state of charge (SOC) according to degradation of the battery is to be predicted, the specific future date being a time point after a beginning of life of the battery, and the lowest SOC indicates a specific SOC at which a current path connected to the battery is blocked in order to prevent the battery from being overdischarged; and predicting, at a processor, the lowest SOC at the specific future date according to the degradation of the battery, wherein the profile data includes:

a first look-up table in which respective open circuit voltages of the battery measured in advance for each SOC of the battery in the beginning of life of the battery are recorded;

a second look-up table in which respective closed circuit voltages of the battery and respective open circuit voltages of the battery for each SOC of an equivalent circuit of the battery in the beginning of life of the battery are recorded; and a third look-up table in which respective resistance increase rates of a resistor predetermined for each use period is recorded, wherein each of the resistance increase rates represents a ratio of (i) a difference between an internal resistance of the battery predetermined for each use period and an initial internal resistance of the battery to (ii) the initial internal resistance of the battery, wherein the step of predicting the lowest SOC at the specific future date includes:

selecting, at the processor, a first SOC associated with a first open circuit voltage corresponding to a predetermined initial final voltage, with reference to the first look-up table, wherein the first open circuit voltage is one of the respective open circuit voltages of the battery recorded in the first look-up table, selecting, at the processor, a closed circuit voltage and a second open circuit voltage associated with the first SOC, with reference to the second look-up table, wherein the selected closed circuit voltage is one of the respective closed circuit voltages of the battery recorded in the second lookup table, and wherein the second open circuit voltage is one of the respective open circuit voltages of the battery recorded in the second lookup table, selecting, at the processor, a resistance increase rate of the resistor associated with a use period corresponding to the specific future date, with reference to the third look-up table, wherein the selected resistance increase rate is one of the respective resistance increase rates recorded in the third lookup table, calculating, at the processor, a voltage increase amount corresponding to a difference between the closed circuit voltage and the second open circuit voltage, by using the selected resistance increase rate, calculating, at the processor, a third open circuit voltage corresponding to a sum of the voltage increase amount and the second open circuit voltage, selecting, at the processor, a second SOC associated with the third open circuit voltage, with reference to the second look-up table, and setting, at the processor, the second SOC as the lowest SOC at the specific future date according to the degradation of the battery, wherein the battery testing method further comprises controlling, at the processor, a charging/discharging circuit which is connected to both ends of the battery so that the current path is blocked when a then-current SOC of the battery reaches the lowest SOC.

8. The battery testing method according to claim 7, wherein the third open circuit voltage is calculated according to the following equation:

$$OCV_{sim\_2} = \Delta V + OCV_{sim\_1} = \{(OCV_{sim\_1} - CCV_{sim}) \times \Delta R_{D\_S}\} + OCV_{sim\_1}$$

where $CCV_{sim}$ represents the selected closed circuit voltage, $OCV_{sim\_1}$ represents the second open circuit voltage, $\Delta R_{D\_S}$ represents the selected resistance increase rate, $\Delta V$ represents the voltage increase amount, and $OCV_{sim\_2}$ represents the third open circuit voltage.

9. The battery testing method according to claim 7, further comprising:

calculating a compensation factor corresponding to a use history of the battery during a predetermined past period of time, wherein in the step of calculating the voltage increase amount by using the selected resistance increase rate further includes calculating the voltage increase amount by using the compensation factor together with the selected resistance increase rate.

10. The battery testing method according to claim 9, wherein the third open circuit voltage is calculated according to the following equation:

$$OCV_{sim\_2} = \Delta V + OCV_{sim\_1} = \{(OCV_{sim\_1} - CCV_{sim}) \times \Delta R_{D\_S} \times F_C\} + OCV_{sim\_1}$$

where $CCV_{sim}$ represents the selected closed circuit voltage, $OCV_{sim\_1}$ represents the second open circuit voltage, $\Delta R_{D\_S}$ represents the selected resistance increase rate, $\Delta V$ represents the voltage increase amount, $F_C$ represents the compensation factor, and $OCV_{sim\_2}$ represents the third open circuit voltage.

* * * * *